(12) United States Patent
De La Cruz et al.

(10) Patent No.: US 6,998,896 B1
(45) Date of Patent: Feb. 14, 2006

(54) DYNAMIC GAIN ADJUSTMENT SYSTEMS AND METHODS FOR METASTABILITY RESISTANCE

(75) Inventors: Louis De La Cruz, Pflugerville, TX (US); Christopher Hume, Austin, TX (US); Allen White, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/829,865

(22) Filed: Apr. 21, 2004

(51) Int. Cl.
*H03K 3/289* (2006.01)
*H03K 3/356* (2006.01)
*H03K 3/12* (2006.01)

(52) U.S. Cl. ............... 327/202; 327/203; 327/208; 327/218

(58) Field of Classification Search ............ 327/199, 327/200, 202, 203, 205, 208–212, 218
See application file for complete search history.

(56) References Cited

U.S. PATENT DOCUMENTS

| | | | |
|---|---|---|---|
| 4,760,283 A * | 7/1988 | Weaver ............... | 327/208 |
| 5,592,114 A * | 1/1997 | Wu et al. ............ | 327/208 |
| 5,754,070 A | 5/1998 | Baumann et al. ..... | 327/198 |
| 5,825,224 A * | 10/1998 | Klass et al. ......... | 327/200 |
| 6,072,346 A | 6/2000 | Ghahremani .......... | 327/198 |
| 6,111,437 A | 8/2000 | Patel ................ | 327/74 |
| 6,198,323 B1 * | 3/2001 | Offord ............... | 327/202 |
| 6,239,626 B1 | 5/2001 | Chesavage ........... | 327/99 |
| 6,300,809 B1 | 10/2001 | Gregor et al. ....... | 327/200 |
| 6,346,836 B1 | 2/2002 | Wieberneit et al. ... | 327/144 |
| 6,384,619 B1 | 5/2002 | Kim et al. .......... | 326/21 |
| 6,411,135 B1 | 6/2002 | Komoto .............. | 327/99 |
| 6,445,236 B1 * | 9/2002 | Bernard et al. ...... | 327/202 |
| 6,459,316 B1 * | 10/2002 | Vangal et al. ....... | 327/202 |
| 6,496,050 B1 | 12/2002 | Lloyd ............... | 327/407 |
| 6,639,449 B1 | 10/2003 | De La Cruz et al. .. | 327/407 |
| 6,646,487 B1 * | 11/2003 | Nedovic et al. ...... | 327/211 |
| 6,803,799 B1 * | 10/2004 | Churchill et al. .... | 327/202 |
| 6,853,228 B1 * | 2/2005 | Hirata et al. ....... | 327/199 |

* cited by examiner

*Primary Examiner*—Tuan T. Lam

(74) *Attorney, Agent, or Firm*—MacPherson Kwok Chen & Heid LLP; Greg J. Michelson

(57) ABSTRACT

Systems and methods provide metastability-resistant techniques. For example, in accordance with an embodiment of the present invention, a flip flop is disclosed having a dynamic gain skewed to provide metastability resistance.

20 Claims, 12 Drawing Sheets

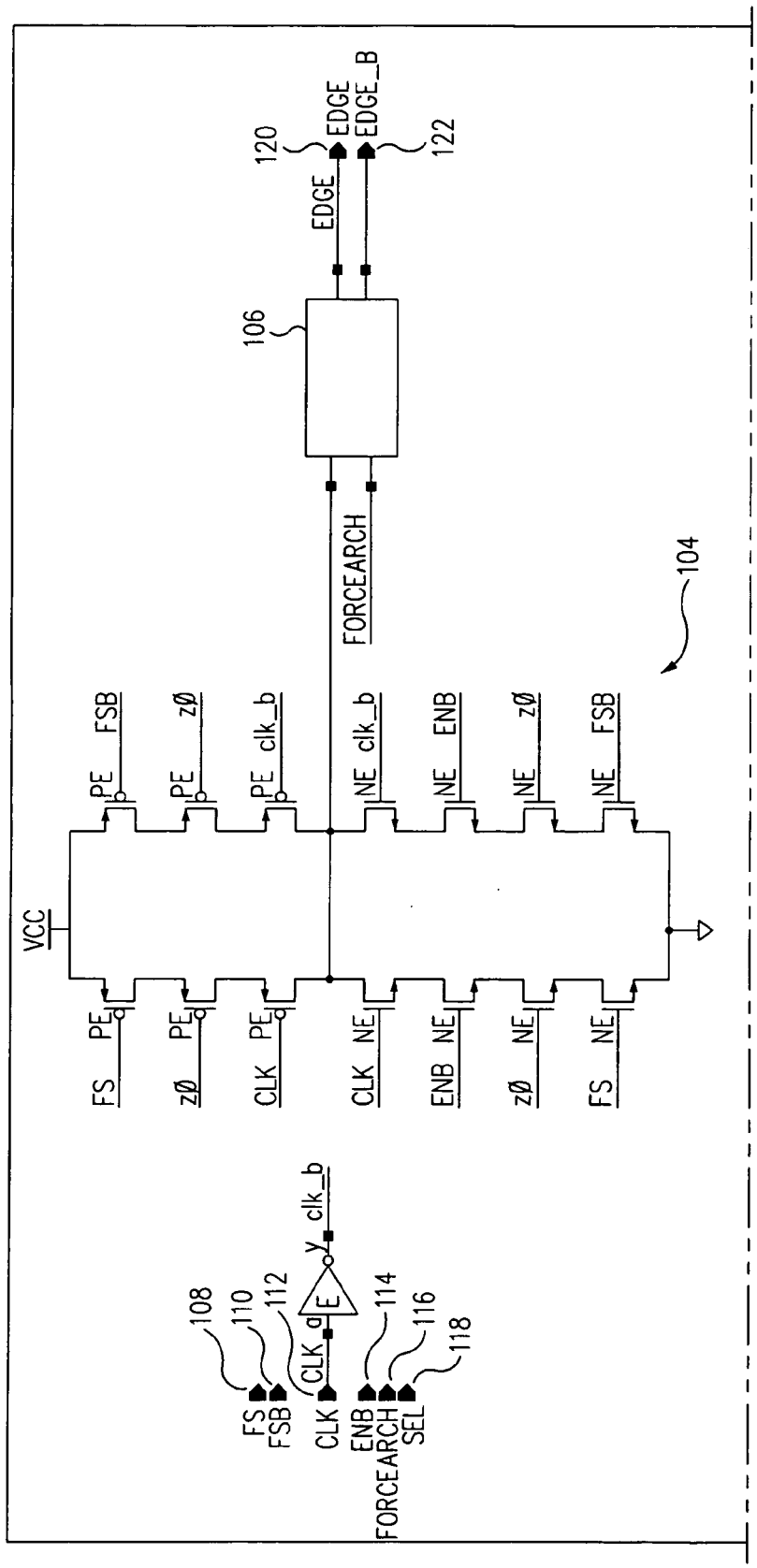

KEY TO FIG. 2

| FIG. 2A |
|---|
| FIG. 2B |

DYNAMIC GAIN ADJUSTMENT SYSTEMS AND METHODS FOR METASTABILITY RESISTANCE

TECHNICAL FIELD

The present invention relates generally to electrical circuits and, more particularly, to dynamic gain adjustment techniques, such as for example for circuit metastability resistance.

BACKGROUND

Integrated circuits and other electrical circuits or devices, such as for example a flip flop, may be susceptible to generating metastable output signals (e.g., an undefined or invalid output signal or that requires an indeterminate amount of time to generate a valid output). For example, when an asynchronous signal enters a given clock domain via a flip flop, there is a possibility of metastability if the asynchronous signal does not meet setup and hold specifications required by the flip flop relative to a clock signal.

A common approach to reduce metastability susceptibility utilizes two flip flops in series so that any metastability in the first flip-flop will have time to resolve by the time the next clock edge arrives at the second flip flop. A drawback of this approach is that the asynchronous signal has a delay of an additional clock cycle, with a worst case input latency of approximately two clock cycles and a best case input latency of approximately one clock cycle.

Another approach to reduce the susceptibility of a flip flop to metastability is to increase the gain of the flip flop circuit so that a metastable situation will likely resolve into a legal state sooner. A drawback of this approach is that the worst case (e.g., infinitely long metastability) or near worst case metastable situations generally take too long to resolve into a legal output state due to the amplification limitations for a very small signal value. As a result, there is a need for improved techniques to reduce metastable susceptibility.

SUMMARY

Systems and methods are disclosed herein to provide circuits resistant to metastability. For example, in accordance with an embodiment of the present invention, a flip flop is disclosed having a dynamic gain adjustment for metastability resistance. The flip flop may include a master circuit and a slave circuit, with the gain of the master circuit dynamically skewed to reduce the possibility of a metastable condition and to bias the master circuit towards resolving to a legal output state of the flip flop opposite to that of a previous legal output state. Consequently, the flip flop will be more resistant to metastability and the flip flop's output signal may be more likely resolved into the next expected legal state as compared to some conventional circuits.

More specifically, in accordance with one embodiment of the present invention, a circuit includes a slave circuit adapted to receive a clock signal and provide an output signal; and a master circuit adapted to receive the output signal, the clock signal, and a data signal and to provide a first signal to the slave circuit based on the data signal, wherein the master circuit is further adapted to provide a logical low level feedback signal and a logical high level feedback signal to bias the output signal towards a valid logical value different than its last valid logical value.

In accordance with another embodiment of the present invention, a flip flop includes a master circuit adapted to receive a clock signal and a data signal and provide a first signal based on the data signal; and a slave circuit adapted to receive the clock signal and the first signal and provide an output signal based on the first signal, wherein the master circuit is further adapted to receive the output signal and provide a value of the first signal that biases the output signal towards a legal logical output value different than its previous legal logical output value.

In accordance with another embodiment of the present invention, a method of providing metastability resistance for a circuit includes receiving a clock signal; receiving a data signal; generating an output signal based on the data signal and a timing of the clock signal; and biasing the output signal towards a legal output state different than its prior legal output state.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1B:
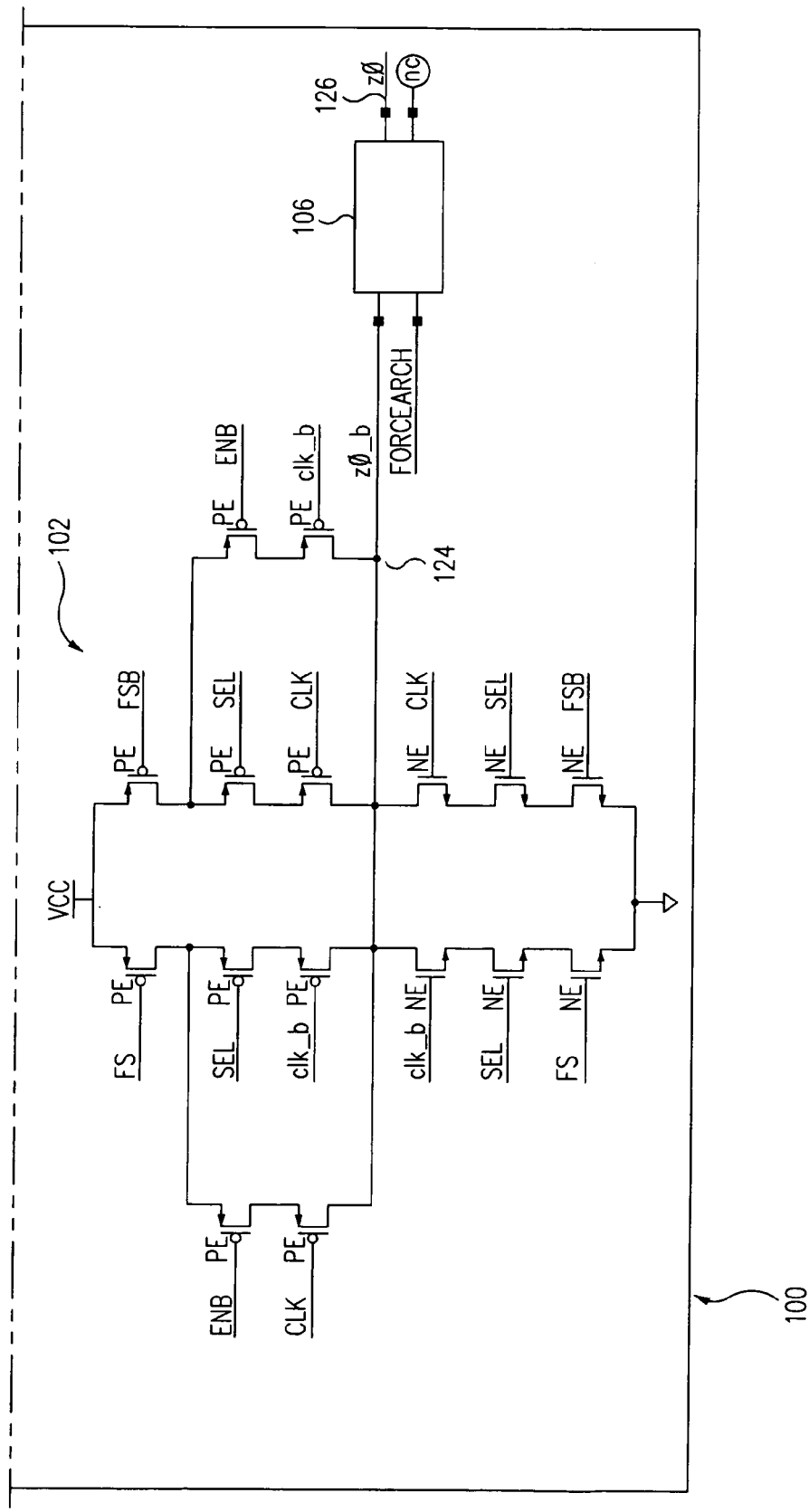
FIG. 1 shows a circuit diagram in accordance with an embodiment of the present invention.

FIG. 1 shows a circuit diagram illustrating a circuit 100 in accordance with an embodiment of the present invention. Circuit 100 includes a master circuit 102 and a slave circuit 104, each having a keeper circuit 106 and a number of transistors arranged in p-type (labeled PE) and n-type (labeled NE) transistor stacks. Circuit 100 receives control signals 108 and 110 (labeled FS and FSB, respectively), a clock signal (CLK) 112, an enable signal (ENB) 114, a reset signal (FORCEARCH) 116, and a select signal (SEL) 118 and provides output signals 120 and 122 (labeled EDGE and EDGE_B, respectively).

Circuit 100 may be utilized in various modes of operation, such as being triggered on a rising or a falling clock edge and may operate as a flip flop or, more specifically for example, as an edge detector. Control signals 108 and 110 (e.g., set by fuses, such as static random access memory cells within a programmable logic device incorporating circuit 100) determine whether circuit 100 is triggered on the rising or the falling clock edge (e.g., control signal 110 is the complement of control signal 108).

As an example, if circuit 100 is employed as a D flip flop, select signal 118 represents the D input signal and output signals 120 and 122 represent Q and $\overline{Q}$ output signals, respectively. Master circuit 102 and slave circuit 104 may also be viewed as operating individually within circuit 100 as flip flop circuits. Enable signal 114 when at a logical high level (or high) allows circuit 100 to operate normally (e.g., pass the D input signal to output signals 120 and 122 under normal D flip flop operation) and when at a logical low level (or low) forces output signals 120 and 122 to maintain their current state. Enable signal 114 may be utilized, for example, as a synchronous reset, which will reset the circuit (e.g., circuit 100) on the next triggering clock edge of clock signal 112 after enable signal 114 is asserted. Reset signal 116 may be utilized, for example, as an asynchronous reset, which will reset the circuit (e.g., circuit 100) immediately when reset signal 116 is asserted.

Circuit 100 may be vulnerable to metastability, for example, when enable signal 114 is at a high and select signal 118 transitions from a low to a high just before clock signal 112 transitions on the triggering clock edge, thus violating the setup requirement. Metastability may not be a problem when enable signal 114 is low, because the p-type transistor stacks in master circuit 102 are switched on when clock signal 112 performs a triggering transition, which pulls the voltage level of a node 124 (e.g., in a metastable state) to approximately a supply voltage level (vcc).

In general certain assumptions may be made with respect to circuit 100. For example, one assumption may be that select signal 118 is glitch free, with the minimum time between transitions greater than a clock period of clock signal 112.

Another assumption may be that if output signal 120 is currently low, then a metastable condition on node 124 was caused by a monotonic transition from low to high on select signal 118 missing the setup requirement and, therefore, the correct resolution of the metastability is to force output signal 120 high. Thus, in the event that the metastability was caused by select signal 118 rising and then falling such that the falling edge of select signal 118 is the cause of the metastability, then output signal 120 should be driven high until the next triggering edge of clock signal 112 arrives.

Another assumption may be that if output signal 120 is currently high, a metastable condition on node 124 is due to a monotonic transition from high to low on select signal 118 missing the setup requirement. Therefore, the correct resolution of the metastability should result in output signal 120 going low. Thus, in the event that the metastability has been caused by select signal 118 falling and then rising such that the rising edge of select signal 118 is the cause of the metastability, then output signal 120 will be driven low until the next triggering edge of clock signal 112 arrives.

Figure 2A:
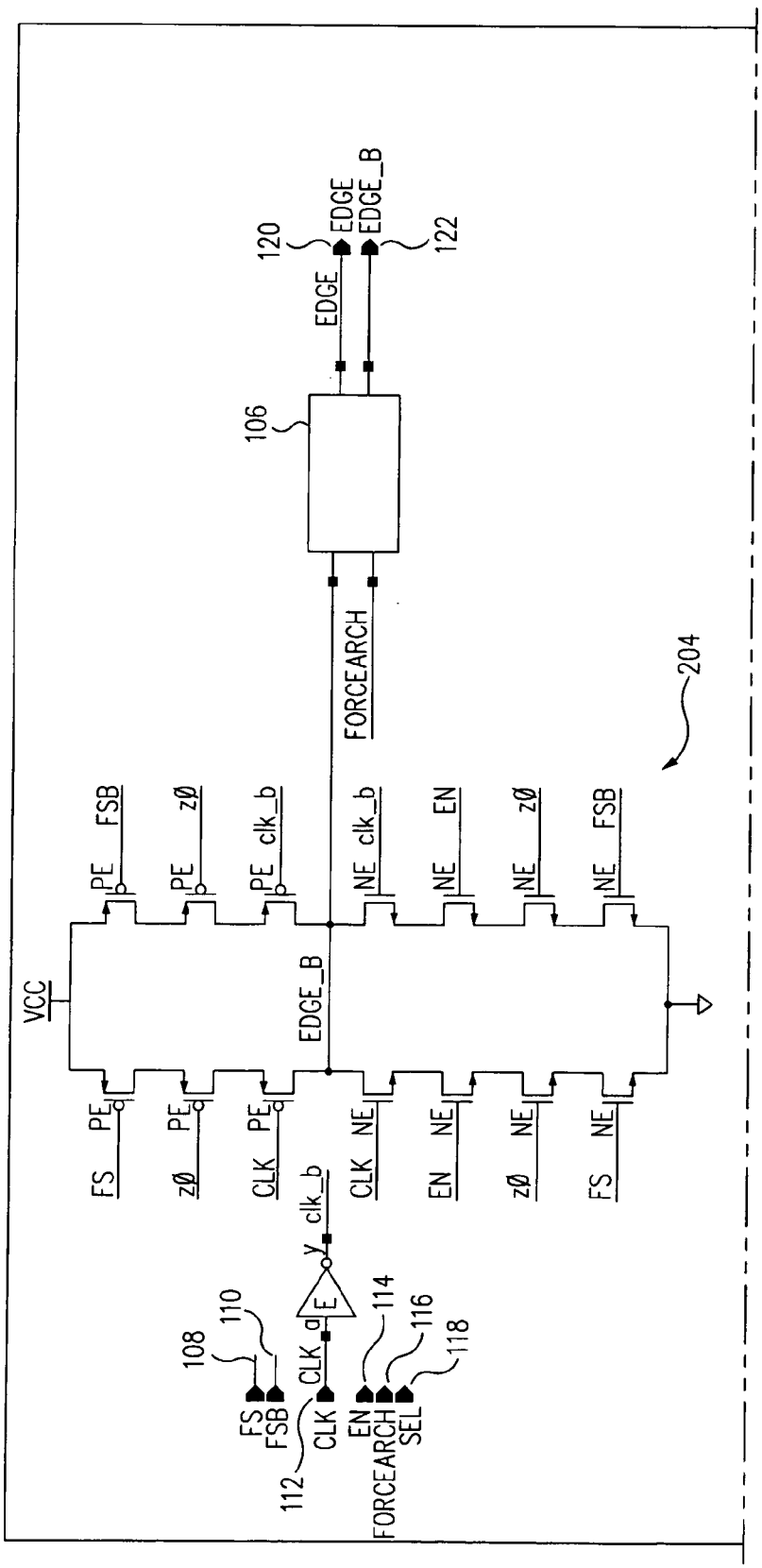
FIG. 2 shows a circuit diagram in accordance with an embodiment of the present invention.
Figure 2B:
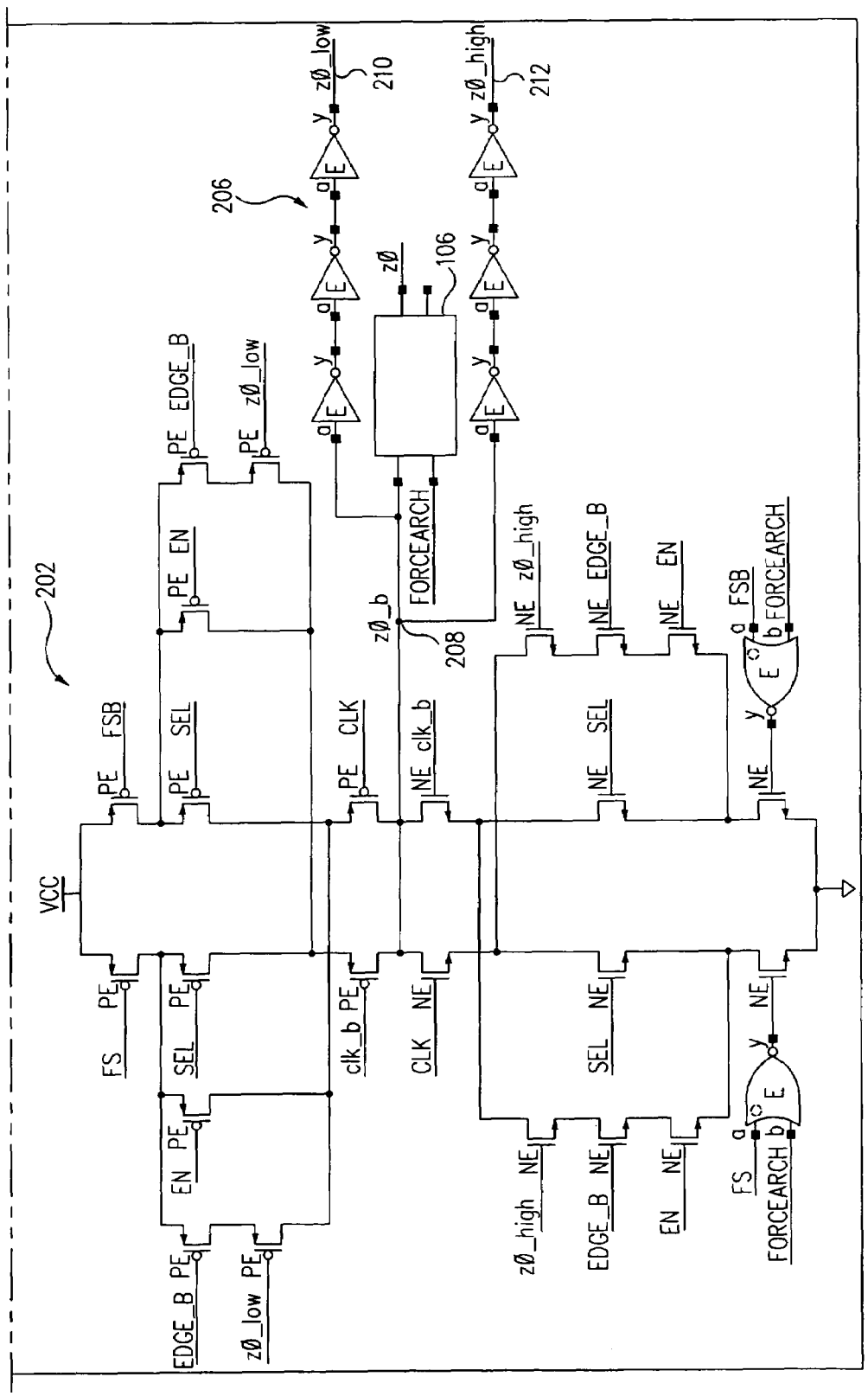

FIG. 2 shows a circuit diagram illustrating a circuit 200 in accordance with an embodiment of the present invention. Circuit 200 may be utilized in various modes of operation, similar to that described for circuit 100 (FIG. 1), but may provide a more metastable-resistant circuit as compared to circuit 100. For example, circuit 200 may resolve in a more timely fashion master latch metastability issues and may be based on one or more of the assumptions listed above.

Circuit 200 includes a master circuit 202 and a slave circuit 204, each having keeper circuit 106 and a number of transistors arranged in p-type (labeled PE) and n-type (labeled NE) transistor stacks. Slave circuit 204 is similar to slave circuit 104 (FIG. 1). However, master circuit 202, as compared to master circuit 102 (FIG. 1), includes also feedback inverter chains 206 and additional p-type (labeled PE) and n-type (labeled NE) transistors (e.g., at least some of which are arranged in stacks as shown) to increase the instability of a node 208 so that a metastable condition will more likely be resolved in the desired direction.

For example, one or more of the additional transistor stacks are enabled by output signal 122, which enables the correct transistor stack based on the state (e.g., low or high) of output signal 122 (e.g., output signal 122 being the complement of output signal 120). One or more of the additional transistor stacks, for example, are switched on by control signals 210 and 212 (labeled z0_low and Z0_high, respectively) from feedback inverter chains 206. Feedback inverter chains 206 provide control signals 210 and 212 whose values are skewed so that when node 208 is in a metastable condition, control signals 210 and 212 have values that are low and high, respectively. For example, p-type and n-type transistor size ratios of inverters within feedback inverter chains 206 may be set to properly skew the values of control signals 210 and 212.

For example, in accordance with an embodiment of the present invention, a gain of master circuit 202 (e.g., a master latch) is dynamically skewed to provide metastability resistance and bias master circuit 202 so that output signal 120 will more likely be resolved to a legal state that is opposite to that of a previous legal state under certain metastable-like conditions. For example, if the last legal value of select signal 118 (e.g., a D input signal that met setup and hold requirements) to circuit 200 (e.g., functioning as a flip flop) was high, the gain of master circuit 202 is skewed such that a subsequent metastable state is resolved as if the value of select signal 118 to circuit 200 was a legal low. Conversely, if the last legal value of select signal 118 was low, the gain of master circuit 202 is skewed such that a subsequent metastable state is resolved as if the value of select signal 118 to circuit 200 was a legal high. The advantage to this solution is that a metastable state is less likely to occur (e.g., as compared to circuit 100) and output signal 120 is resolved into the next expected legal state (e.g., instead of waiting for a metastable state to resolve on its own by applying a neutral gain as in some conventional circuits).

Figure 3:
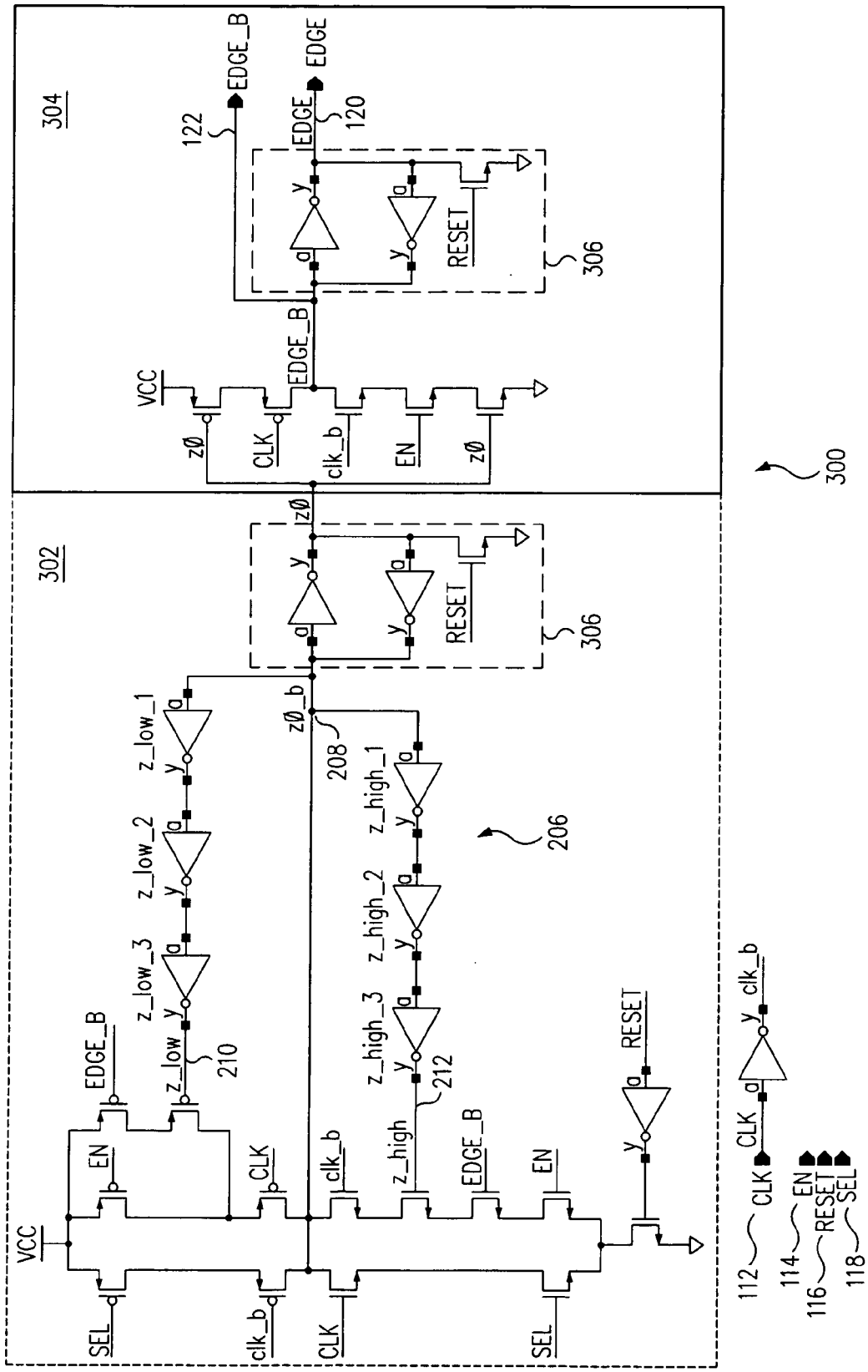
FIG. 3 shows a circuit diagram in accordance with an embodiment of the present invention.

FIG. 3 shows a circuit diagram illustrating a circuit 300 in accordance with an embodiment of the present invention. Circuit 300 may be viewed as a distilled version of circuit 200 (FIG. 2), with for example the disabled transistor stacks and the transistors controlled by control signals 108 and 110 (e.g., fuse-controlled transistors) removed for clarity. For example, circuit 300 includes a master circuit 302 and a slave circuit 304, which correspond to master circuit 202 and slave circuit 204 of FIG. 2. A keeper circuit 306 may be viewed as an exemplary circuit implementation for keeper circuit 106 of FIGS. 1 and 2.

As an exemplary implementation, circuit 300 may function as a falling clock edge triggered D flip flop with enable signal 114 synchronous (i.e., a synchronous reset) and reset signal 116 asynchronous (i.e., an asynchronous reset). As illustrated in FIG. 3, output signal 122 of slave circuit 304 is fed back to master circuit 302 to provide its last legal output value and, depending upon the value, enable either the p-type or n-type transistor stack. Feedback inverter chains 206 provide control signals 210 and 212 to control the p-type transistor stack and the n-type transistor stack, respectively, with values of low and high, respectively, for control signals 210 and 212 (e.g., during a metastable-like condition). Therefore, if the last legal value of output signal 120 was high and a metastable-like condition occurs, then the next expected value of output signal 120 will be low. Likewise, if the last legal value of output signal 120 was low and a metastable-like condition occurs, then the next expected value of output signal 120 will be high.

In accordance with an embodiment of the present invention and as an exemplary implementation example, an acceptable high on node 208, for example, may be one that resolves to an output voltage of 0.8 V within 200 ps, while an acceptable low on node 208, for example, may be one that resolves to an output voltage of 0.2 V within 200 ps. As an example, the probability ($P_{init}$) that select signal 118 is undefined when clock signal 112 falls (falling edge triggered) may be defined as in equation (1):

$$P_{init} = \frac{\frac{V_{IH} - V_{IL}}{V_{swing}} * t_r}{T_{signal}} \quad (1)$$

where $V_{IH}$ is defined as the lowest input voltage of select signal 118 that will produce an acceptable low on node 208 (and consequently an acceptable high on output signal 120), $V_{IL}$ is defined as the highest input voltage of select signal 118 that will produce an acceptable high on node 208 (and consequently and acceptable low on output signal 120), $V_{swing}$ is defined as the total voltage range (e.g., the value of supply voltage (vcc)), $t_r$ is defined as the rise time, and $T_{signal}$ is the average period between transitions of select signal 118. The numerator of equation (1) is the length of the temporal window in which a transition will cause a metastable event.

The average number of errors per second ($N_{sync}(0)$) may be defined as in equation (2):

$$N_{sync}(0) = \frac{P_{init}}{T_\Phi} \quad (2)$$

where $T_\Phi$ is the period of clock signal 112.

The numerator of equation (1), for example, may be determined by sweeping the timing of the transition of select signal 118 with respect to clock signal 112. For example, the metastable window may be determined as 10 fs wide for circuit 100 of FIG. 1. The average period of select signal 118 may depend on a specific design implementation (e.g., a user's design) and may be left as a variable for these implementation examples. As an example for clock signal 112 having a value of 1 GHz, the average number of errors per second ($N_{sync}(0)$) may be as defined in equation (3):

$$N_{sync}(0) = \frac{\frac{10 * 10^{-15}}{T_{signal}}}{1 * 10^{-9}} = \frac{1 * 10^{-15}}{T_{signal}} \quad (3)$$

Thus for this example, an average of one metastable incident per $10^5$ transitions of select signal 118 may occur for circuit 100 (FIG. 1). In contrast, the metastable window may be determined as 0.063 fs wide for circuit 200 of FIG. 2. If the same analysis was applied, with clock signal 112 having a value of 1 GHz, an average of one metastable incident per $15.9 * 10^6$ transitions of select signal 118 may occur for circuit 200, which is a reduction in the metastable incident frequency by a factor of approximately 159 for circuit 200 as compared to circuit 100.

Figure 4:
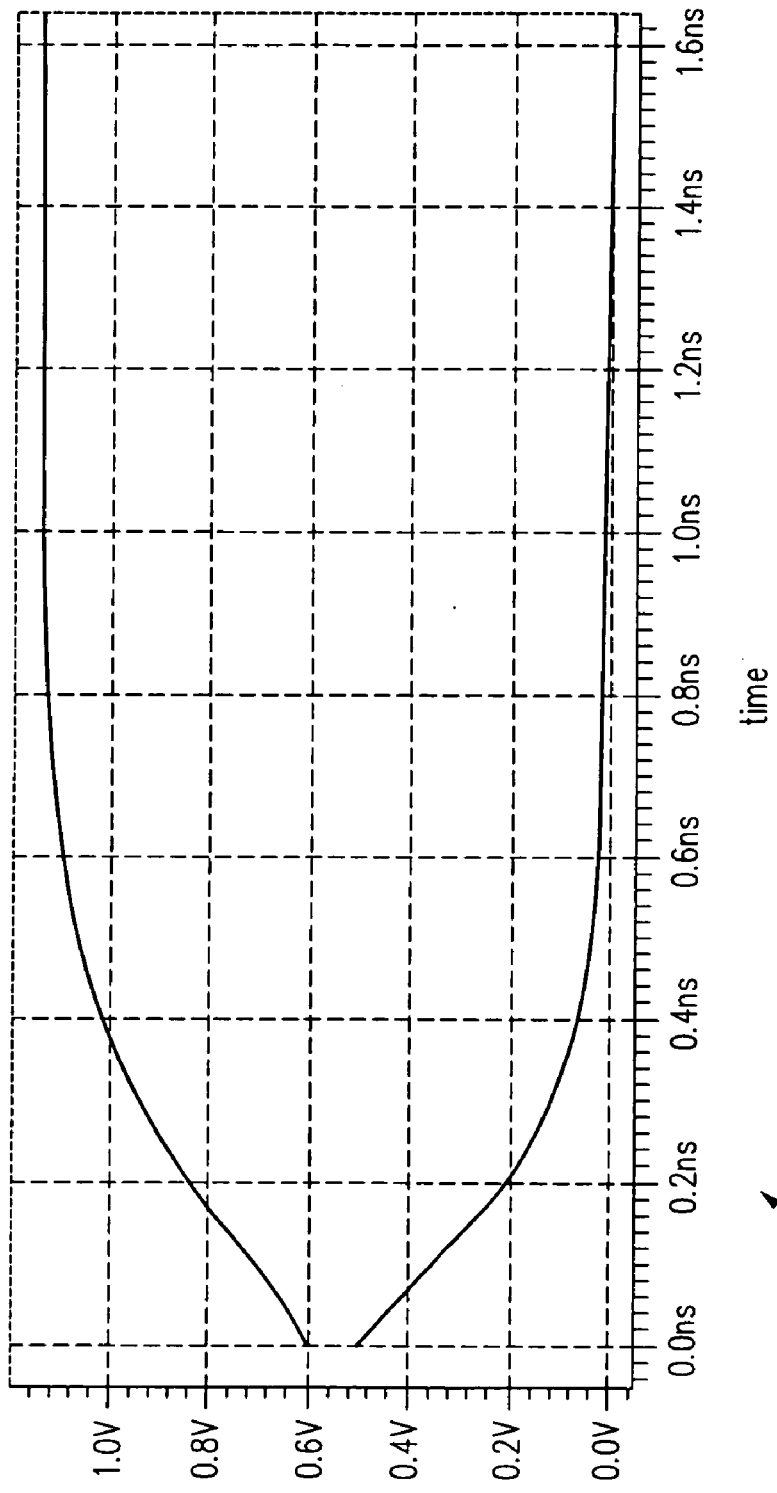
FIG. 4 shows an exemplary plot illustrating a metastability window for the circuit of FIG. 1 in accordance with an embodiment of the present invention.

Circuits 100 and 200 may also be evaluated by setting a series of initial conditions on node 124 and node 208, respectively, to determine the range of voltages that may result in a metastability condition taking longer than 200 ps to resolve to an acceptable high or low value. For example, FIG. 4 shows an exemplary plot illustrating a metastability window for circuit 100 of FIG. 1 in accordance with an embodiment of the present invention. For a supply voltage (vcc) of 1.14 V, the plot shows that a trapped charge at node 124 of 0.6 V and 0.5 V will resolve high and low, respectively. A trapped charge at node 124 between 0.5 V and 0.6 V (a 100 mV wide voltage window) will generally take longer than the 200 ps time limit before resolving to a legal high or low.

Figure 5:
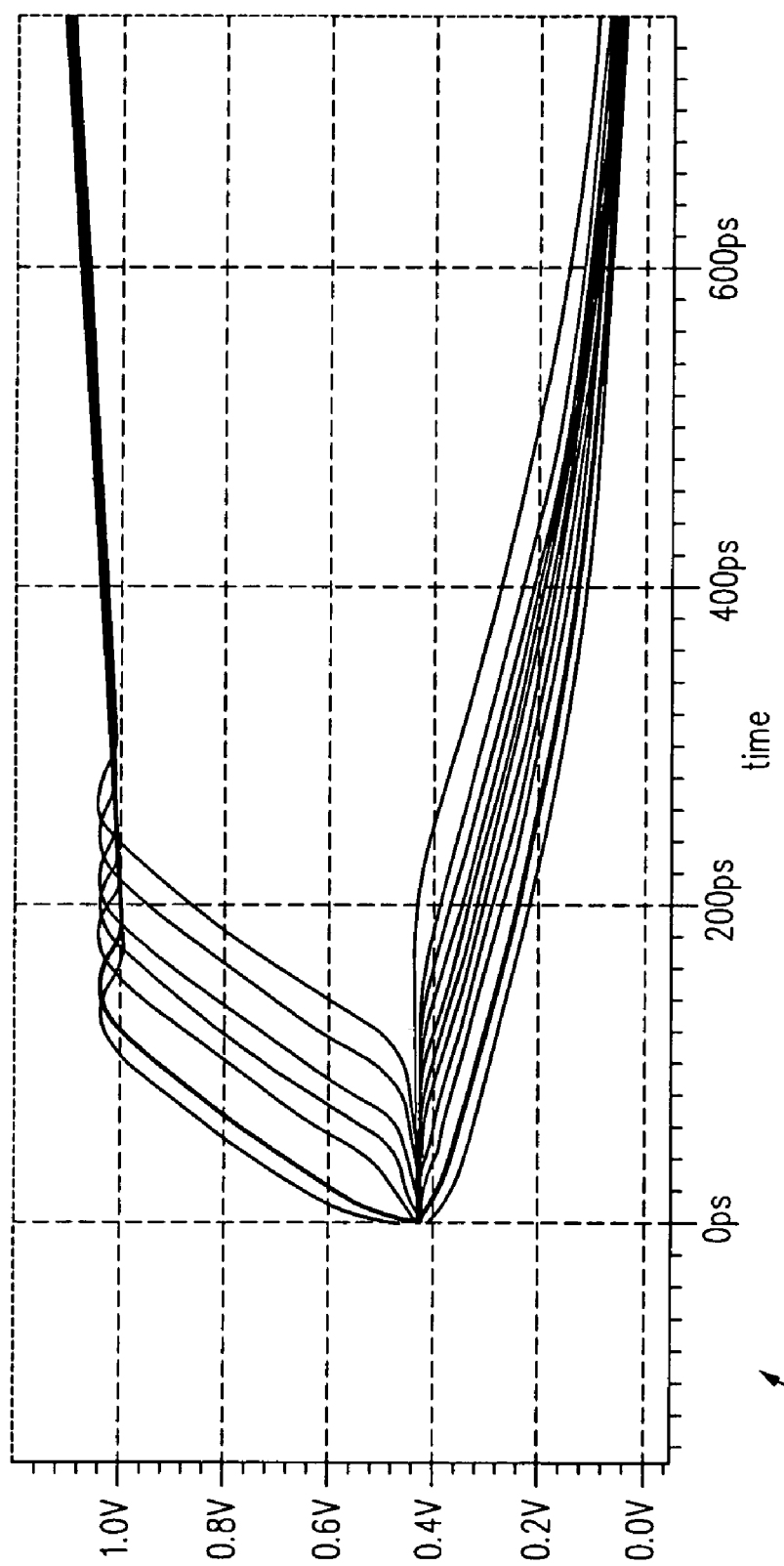
FIG. 5 shows an exemplary plot illustrating a metastability window for the circuit of FIG. 2 in accordance with an embodiment of the present invention.
Figure 6:
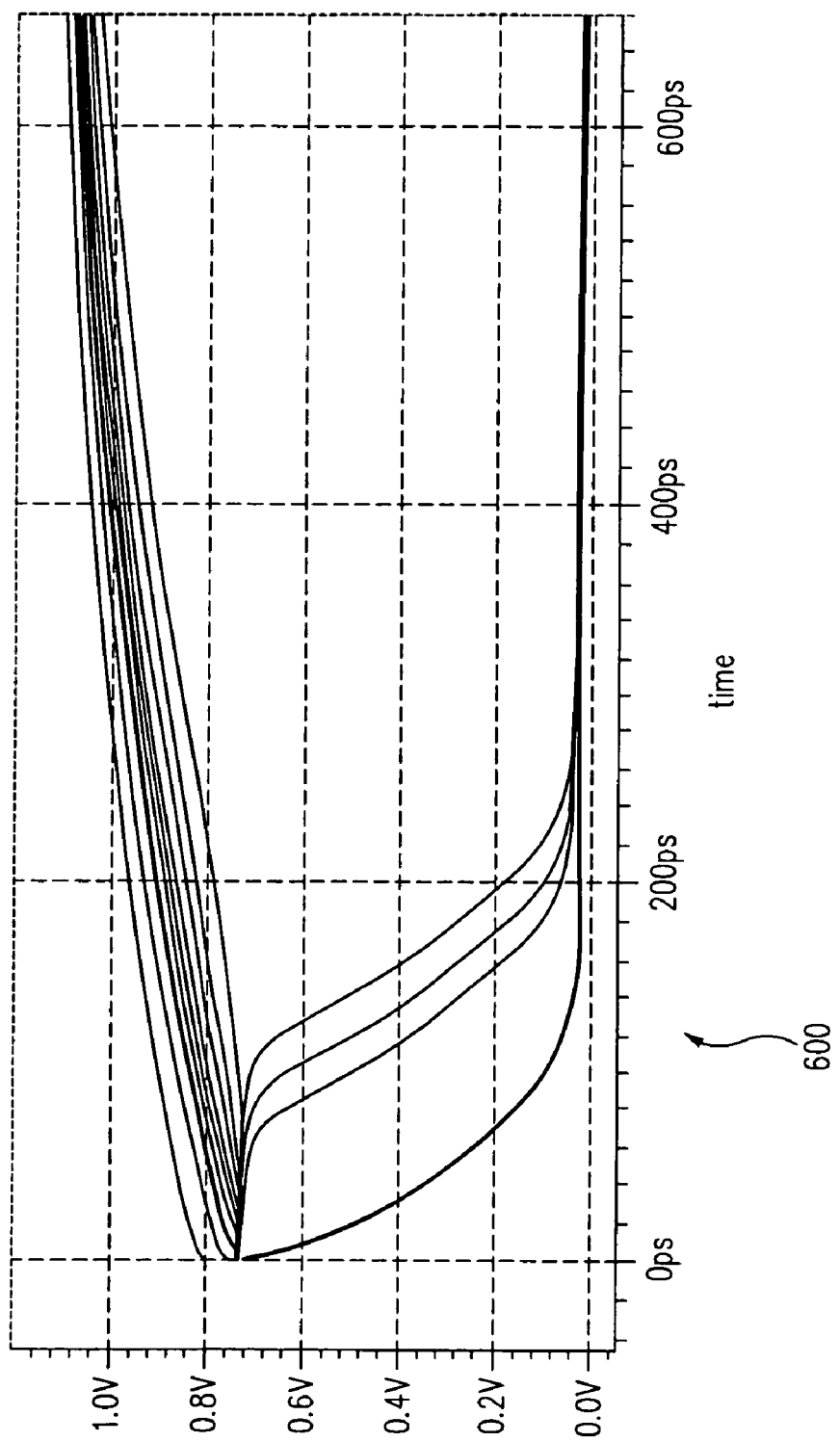
FIG. 6 shows an exemplary plot illustrating a metastability window for the circuit of FIG. 2 in accordance with an embodiment of the present invention.

For circuit 200 of FIG. 2, there may be two different metastability points that are differentiated by the state of output signal 120. For example, when output signal 120 is low, FIG. 5 shows an exemplary plot illustrating a metastability window for circuit 200 in accordance with an embodiment of the present invention. In this state, the curves sloping toward the bottom of FIG. 5 can be ignored because a metastable state that does not resolve high (i.e., resolves low) will not cause output signal 120 to change, so it will not adversely affect the operation of circuit 200. As another example, when output signal 120 is high, FIG. 6 shows an exemplary plot illustrating a metastability window for circuit 200 in accordance with an embodiment of the present invention. In this state, the curves sloping toward the top of FIG. 6 can be ignored because a metastable state that resolves high will not adversely affect output signal 120. In both cases shown illustrated in FIGS. 5 and 6, the width of the metastable regions is approximately 6 $\mu$V, which represents an improvement of approximately $16.7 * 10^3$ as compared to circuit 100 (FIG. 1).

As noted above, circuit 100 and/or circuit 200 may be operated in various modes and may be implemented in various types of circuits. For example, circuit 100 and/or circuit 200 may be part of an asynchronous clock multiplexer and be operated as edge detectors, such as described in U.S. Pat. No. 6,639,449 entitled "Asynchronous Glitch-Free Clock Multiplexer," which is incorporated herein by reference in its entirety. As an example, circuit 100 or circuit 200 may represent an exemplary circuit implementation for edge detector circuits 25, 30, 40, and/or 45, which are described as part of a clock multiplexer circuit in U.S. Pat. No. 6,639,449.

Figure 7:
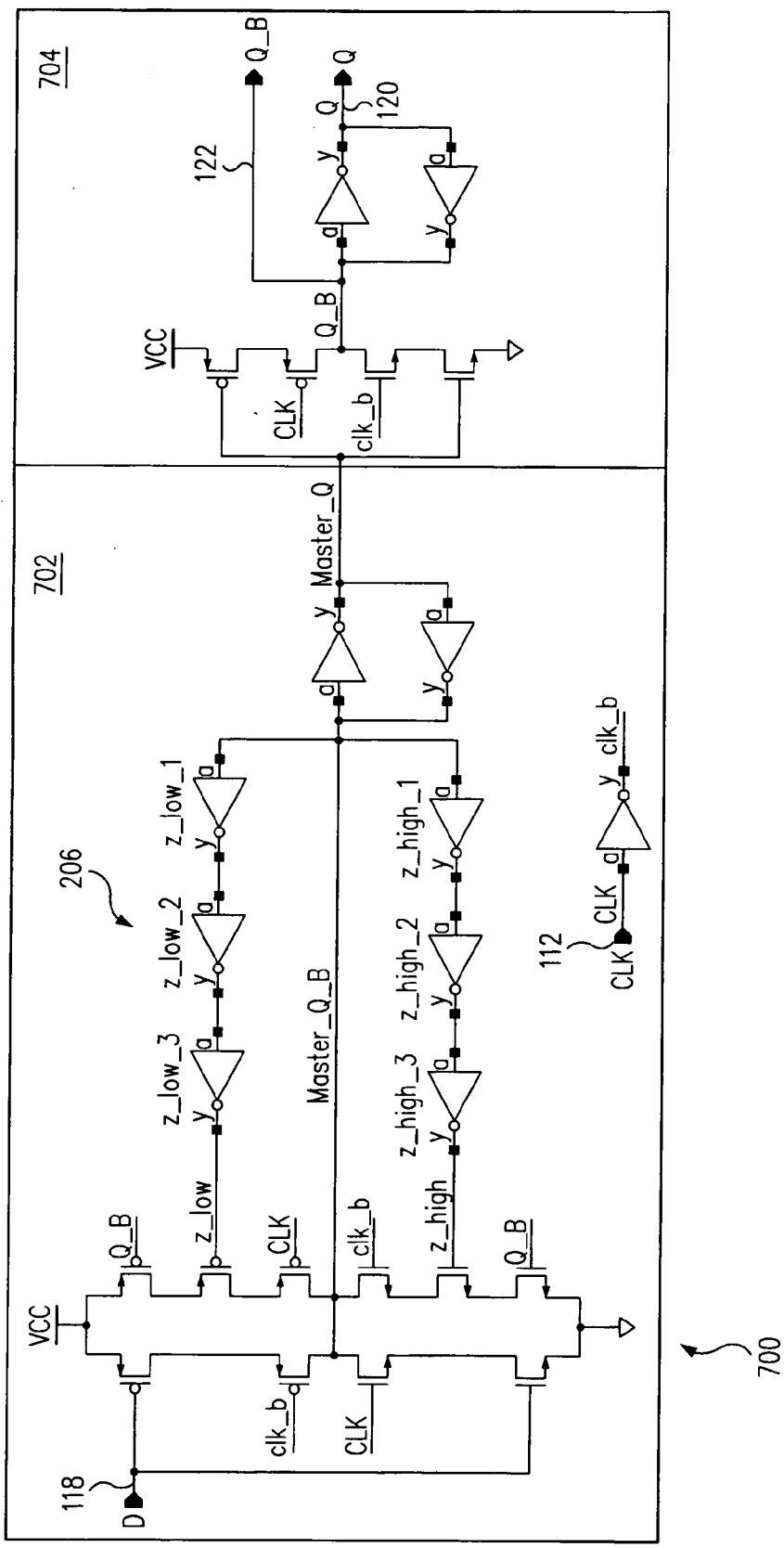
FIG. 7 shows a circuit diagram in accordance with an embodiment of the present invention.

FIG. 7 shows a circuit diagram illustrating a circuit 700 in accordance with an embodiment of the present invention. Circuit 700 may be viewed as another distilled version of circuit 200 (FIG. 2), with various signals (e.g., enable signal 114, reset signal 116, and control signal 108 and 110) and transistors, such as for example the disabled transistor stacks and the transistors controlled by control signals 108 and 110 (e.g., fuse-controlled transistors) removed for clarity.

For example, circuit 700 includes a master circuit 702 and a slave circuit 704, which correspond to master circuit 202 and slave circuit 204 of FIG. 2. As an exemplary implementation, circuit 700 may function as a falling clock edge triggered D flip flop with various signals labeled according to a typical D flip flop naming convention.

Figure 8:
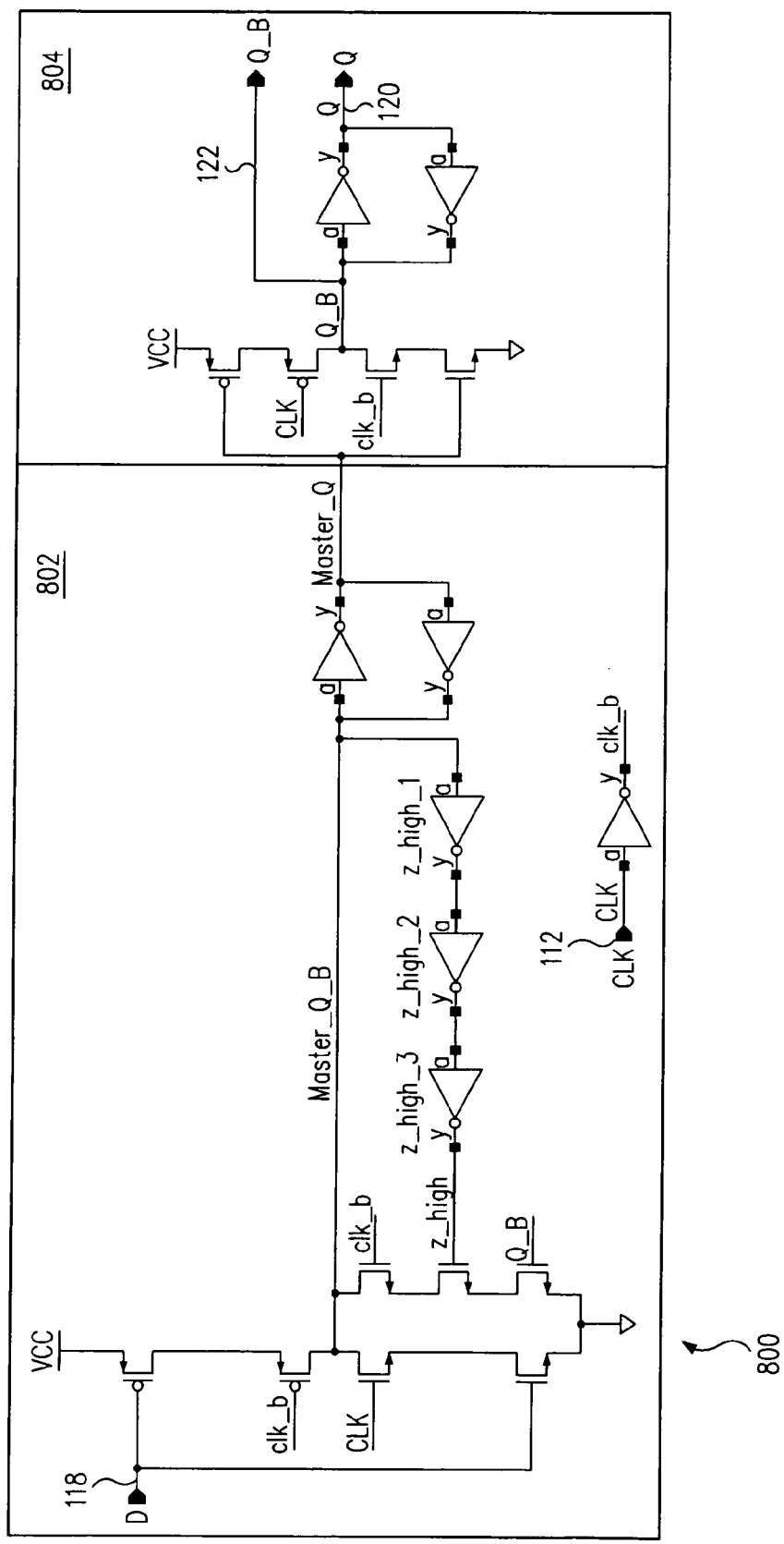
FIGS. 8 and 9 shows simplified circuit diagrams for FIG. 7 based on assumed output states in accordance with an embodiment of the present invention.
Figure 9:
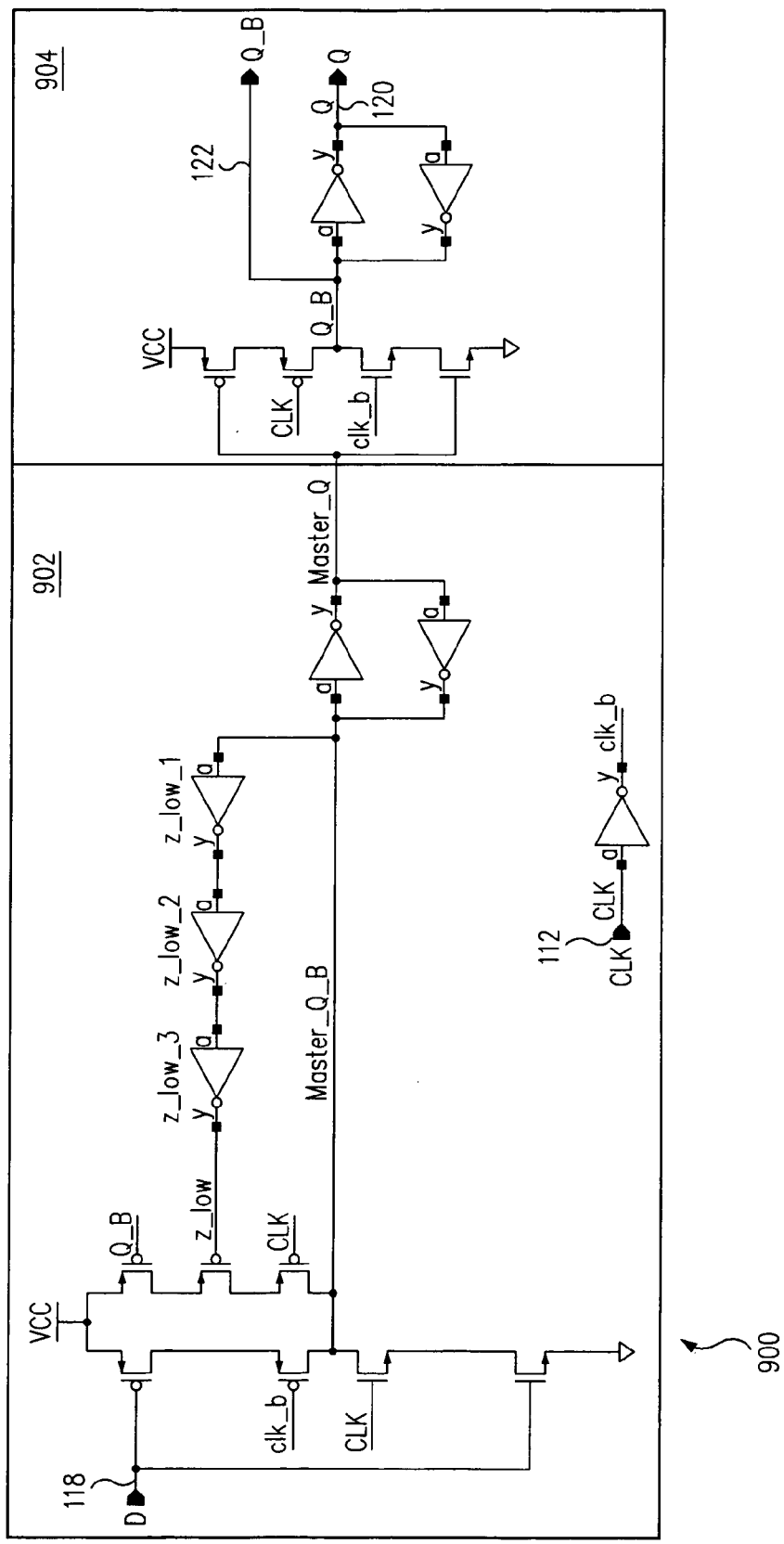

As illustrated in FIG. 7, output signal 122 is fed back to master circuit 702 to help resolve the next value of output signal 120 to its next expected state (e.g., such as during a metastable-like condition). As an example, FIGS. 8 and 9 illustrate circuits 800 and 900, respectively, which are simplified circuit diagrams for FIG. 7 based on assumed output states in accordance with an embodiment of the present invention.

Specifically, circuit 800 provides an exemplary circuit illustration of circuit 700 when output signal 120 is high (i.e., various circuit elements which are disabled when output signal 120 is high (output signal 122 low) have been removed to provide clarity). Similarly, circuit 900 provides an exemplary circuit illustration of circuit 700 when output signal 120 is low (output signal 122 high).

Figure 10:
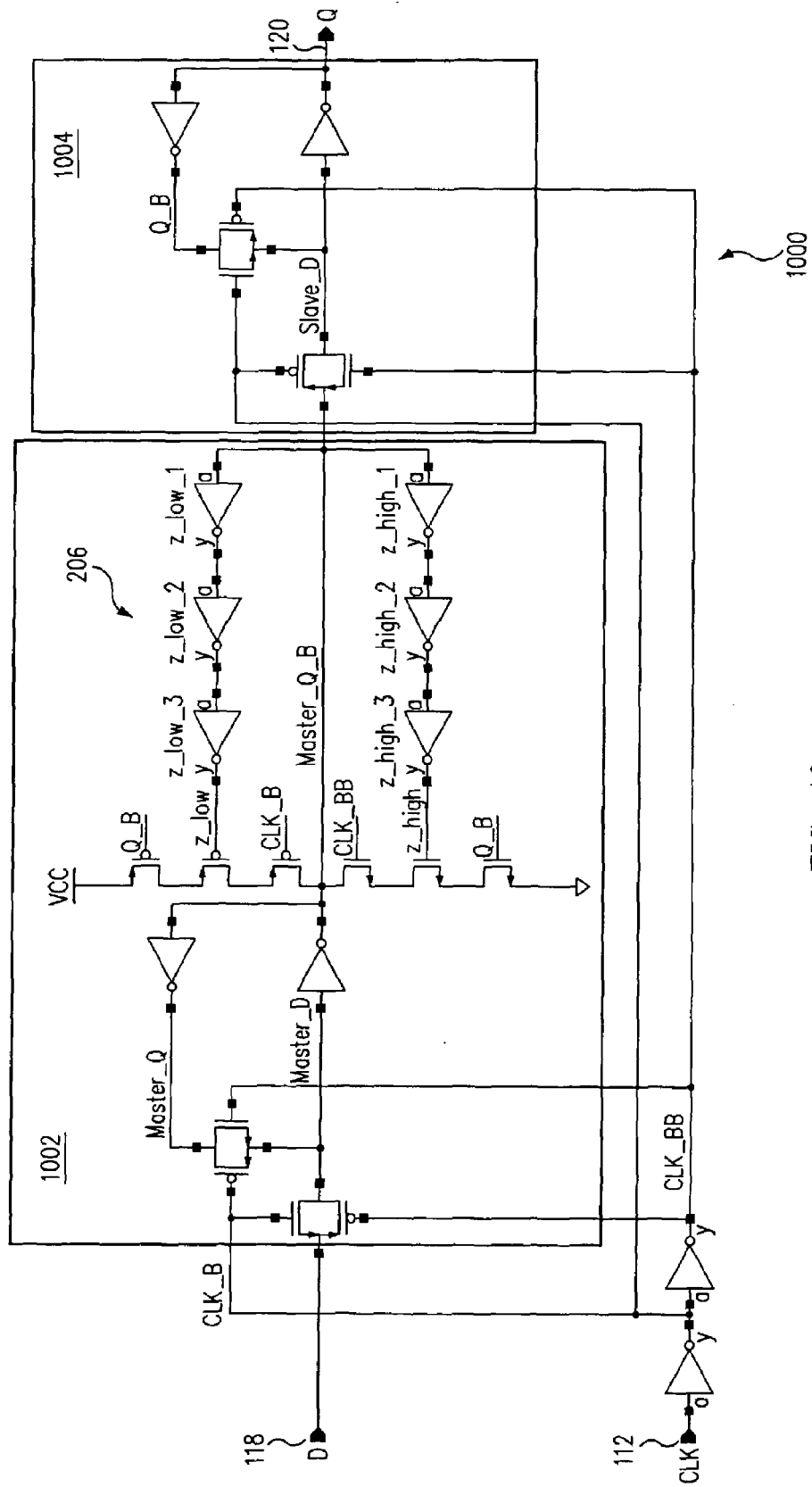
FIG. 10 shows a circuit diagram in accordance with an embodiment of the present invention.

The techniques disclosed herein, in accordance with one or more embodiments of the present invention, are not limiting and may be applicable to a variety of circuit implementations. For example, FIG. 10 shows a circuit diagram illustrating a circuit 1000 in accordance with an embodiment of the present invention. Circuit 1000 is a rising edge triggered flip flop and includes a master circuit 1002 and a slave circuit 1004, with master circuit 1002 having feedback inverter chains 206. Circuit 1000 provides an example of another type (e.g., style or design) of flip flop implementing one or more of the techniques disclosed herein. Furthermore, the techniques disclosed herein are not limited to rising (positive) or falling (negative) edge triggered circuits and may or may not have any combination of set, reset (e.g., synchronous and/or asynchronous), and/or enable signals or their complements.

Embodiments described above illustrate but do not limit the invention. It should also be understood that numerous modifications and variations are possible in accordance with the principles of the present invention. Accordingly, the scope of the invention is defined only by the following claims.

We claim:

1. A circuit comprising:
a slave circuit adapted to receive a clock signal and provide an output signal; and
a master circuit adapted to receive the output signal, the clock signal, and a data signal and to provide a first signal to the slave circuit based on the data signal, wherein the master circuit is further adapted to provide a logical low level feedback signal and a logical high level feedback signal to bias the output signal towards a valid logical value different than its last valid logical value.

2. The circuit of claim 1, wherein the slave circuit and the master circuit each comprise:
a keeper circuit adapted to latch a signal value; and
p-type and n-type transistor stacks.

3. The circuit of claim 1, wherein the logical low level feedback signal and the logical high level feedback signal skew a gain of the master circuit.

4. The circuit of claim 1, wherein the circuit is utilized as a flip flop or as an edge detector.

5. The circuit of claim 1, wherein the circuit forms part of a programmable logic device.

6. The circuit of claim 1, wherein the slave circuit and the master circuit are further adapted to receive an enable signal, wherein the enable signal controls whether the output signal maintains its current state regardless of a value of the data signal.

7. The circuit of claim 1, wherein the slave circuit and the master circuit are further adapted to receive a control signal, wherein the control signal controls whether the circuit is triggered on a rising edge or a falling edge of the clock signal.

8. A flip flop comprising:
a master circuit adapted to receive a clock signal and a data signal and provide a first signal based on the data signal; and
a slave circuit adapted to receive the clock signal and the first signal and provide an output signal based on the first signal, wherein the master circuit is further adapted to receive the output signal and generate a logical low level feedback signal and a logical high level feedback signal to provide a value of the first signal that biases the output signal towards a legal logical output value different than its previous legal logical output value.

9. The flip flop of claim 8, wherein the value of the first signal is generated by dynamically skewing a gain of the master circuit.

10. The flip flop of claim 8, wherein the output signal is provided to the master circuit to enable a transistor stack based on a value of the output signal.

11. The flip flop of claim 8, wherein the flip flop is incorporated within a programmable logic device.

12. The flip flop of claim 8, wherein the slave circuit and the master circuit are further adapted to receive an enable signal, wherein the enable signal controls whether the output signal maintains its current state regardless of a value of the data signal.

13. The flip flop of claim 8, wherein the slave circuit and the master circuit are further adapted to receive a control signal, wherein the control signal controls whether the flip flop is triggered on a rising edge or a falling edge of the clock signal.

14. The flip flop of claim 8, wherein the master circuit further comprises a feedback inverter chain adapted to provide the logical low level feedback signal and the logical high level feedback signal, which along with a current value of the output signal, influences the value of the next legal logical output value of the output signal.

15. A method of providing metastability resistance for a circuit, the method comprising:
receiving a clock signal;
receiving a control signal which determines whether the circuit is triggered on a rising edge or a falling edge of the clock signal;
receiving a data signal;
generating an output signal based on the data signal and a timing of the clock signal; and
biasing the output signal towards a legal output state different than its prior legal output state.

16. The method of claim 15, wherein the biasing comprises providing a logical low level feedback signal and a logical high level feedback signal within the circuit along with providing the output signal as a feedback signal.

17. The method of claim 16, wherein the logical low level feedback signal and the logical high level feedback signal skew a gain of the circuit.

18. The method of claim 15, wherein the data signal is asynchronous.

19. The method of claim 15, further comprising utilizing the circuit as a D flip flop.

20. The method of claim 15, further comprising receiving an enable signal which controls whether the output signal maintains its current legal output state regardless of a value of the data signal.

* * * * *